United States Patent
Zhang et al.

(10) Patent No.: US 10,000,652 B2
(45) Date of Patent: Jun. 19, 2018

(54) PROCESS FOR DEPOSITING METAL ON A SUBSTRATE

(71) Applicant: National Research Council of Canada, Ottawa (CA)

(72) Inventors: Zhiyi Zhang, Ottawa (CA); Ye Tao, Ottawa (CA); Hiroshi Fukutani, Limoges (CA); Gaozhi Xiao, Ottawa (CA)

( * ) Notice: Subject to any disclaimer, the term of this patent is extended or adjusted under 35 U.S.C. 154(b) by 0 days. days.

(21) Appl. No.: 14/906,670

(22) PCT Filed: Jul. 16, 2014

(86) PCT No.: PCT/CA2014/050675
§ 371 (c)(1),
(2) Date: Jan. 21, 2016

(87) PCT Pub. No.: WO2015/010198
PCT Pub. Date: Jan. 29, 2015

(65) Prior Publication Data
US 2016/0160066 A1    Jun. 9, 2016

Related U.S. Application Data

(60) Provisional application No. 61/857,734, filed on Jul. 24, 2013.

(51) Int. Cl.
C09D 11/52    (2014.01)
C23C 18/16   (2006.01)
(Continued)

(52) U.S. Cl.
CPC ............ C09D 11/52 (2013.01); C09D 11/037 (2013.01); C09D 11/322 (2013.01); C09D 11/38 (2013.01);
(Continued)

(58) Field of Classification Search
CPC ........ C23C 18/06; C23C 18/16; C23C 18/161
See application file for complete search history.

(56) References Cited

U.S. PATENT DOCUMENTS 3,962,497 A   6/1976 Doty et al.
4,204,013 A   5/1980 Arcilesi et al.
(Continued)

FOREIGN PATENT DOCUMENTS

EP   0878235 A1   11/1998
EP   2581469 A1   4/2013
WO   2013096664 A1   6/2013

OTHER PUBLICATIONS

Extended European Search report dated Nov. 23, 2016 on European Applicaiton 14829173.5.
(Continued)

*Primary Examiner* — Nathan H Empie
(74) *Attorney, Agent, or Firm* — Brunet & Co. Ltd.; Robert A. H. Brunet; Hans Koenig

(57) ABSTRACT

A process for depositing a metal on a substrate involves the use of two reduction reactions in a bottom-up based tandem manner starting from a substrate surface and working upward. A first reduction reaction starts on the substrate surface at ambient temperature, and a second reduction reaction, which is initiated by the reaction heat of the first reduction reaction, occurs in a reactive ink solution film coated on top, which becomes solid after the reaction. Gas and other small molecules generated from the reduction reactions, and the solvent, can readily escape through the upper surface of the film before the solid metal layer is formed or during post-treatment, with no or few voids left in the metal film. Thus, the process can be used to form highly conductive films and features at ambient temperature on various substrates.

13 Claims, 3 Drawing Sheets

(51) Int. Cl.
| | |
|---|---|
| C09D 11/54 | (2014.01) |
| C23C 18/20 | (2006.01) |
| C23C 18/31 | (2006.01) |
| C23C 18/40 | (2006.01) |
| C23C 18/44 | (2006.01) |
| H05K 3/18 | (2006.01) |
| H05K 3/24 | (2006.01) |
| C09D 11/037 | (2014.01) |
| C09D 11/322 | (2014.01) |
| C09D 11/38 | (2014.01) |
| C23C 16/06 | (2006.01) |
| H05K 3/12 | (2006.01) |

(52) U.S. Cl.
CPC .............. *C09D 11/54* (2013.01); *C23C 16/06* (2013.01); *C23C 18/161* (2013.01); *C23C 18/166* (2013.01); *C23C 18/1676* (2013.01); *C23C 18/1678* (2013.01); *C23C 18/2066* (2013.01); *C23C 18/31* (2013.01); *C23C 18/40* (2013.01); *C23C 18/44* (2013.01); *H05K 3/182* (2013.01); *H05K 3/241* (2013.01); *H05K 3/12* (2013.01); *H05K 2203/1105* (2013.01); *H05K 2203/1157* (2013.01)

(56) References Cited

U.S. PATENT DOCUMENTS

| | | | |
|---|---|---|---|
| 4,515,829 | A | 5/1985 | Deckert et al. |
| 4,592,929 | A | 6/1986 | Tubergen et al. |
| 4,610,895 | A | 9/1986 | Tubergen et al. |
| 4,737,188 | A | 4/1988 | Bahls |
| 4,775,449 | A | 10/1988 | Dumas et al. |
| 4,999,251 | A | 3/1991 | Foust et al. |
| 5,421,989 | A | 6/1995 | Elisabeth et al. |
| 6,383,269 | B1 | 5/2002 | Toben et al. |
| 6,911,230 | B2 | 6/2005 | Kanzler |
| 9,538,665 | B2 | 1/2017 | Bastenbeck et al. |
| 2005/0006339 | A1 | 1/2005 | Mardilovich et al. |
| 2005/0130397 | A1 | 6/2005 | Bentley et al. |
| 2006/0001726 | A1 | 1/2006 | Kodas et al. |
| 2006/0130700 | A1 | 6/2006 | Reinartz |
| 2006/0286304 | A1 | 12/2006 | Leskela et al. |
| 2008/0093422 | A1 | 4/2008 | Kodas et al. |
| 2009/0142482 | A1 | 6/2009 | Yuning et al. |
| 2009/0297802 | A1 | 12/2009 | Sastry et al. |
| 2010/0155255 | A1 | 6/2010 | Nagao et al. |
| 2011/0318478 | A1 | 12/2011 | Parashar et al. |

OTHER PUBLICATIONS

Wojtysiak S and Kudelski A. Colloids and Surfaces A: Physiochemcial and Engineering Aspects. 410 (2012) 45-51.

Dearden, A., A Low Curing Temperature Silver Ink for Use in Ink-Jet Printing and Subsequent Production of Conductive Tracks, Macromolecular Rapid Communications, 2005, pp. 315-318, vol. 26, Verlag GmbH & Co. KGaA, Weinham.

Dong et al, Physical Chemistry Chemical Physics, One-step Synthesis of Uniform Silver Nanoparticles Capped by Saturated Decanoate: Direct Spray Printing Ink to Form Metallic Silver Films, 2009, pp. 6269-6275, vol. 11, Owners Society.

Ohno, Izumi, Electroless Deposition of Palladium and Platinum, Modern Electroplating, Fifth Edition, 2010, pp. 477-482, John Wiley & Sons, Inc.

Lee et al, Colloids and Surfaces A: Physicochemical and Engineering Aspects, webpage, 2011, pp. 85-91, Department of Chemical and Materials Engineering, National Kaohsiung University of Applied Science, Kaohsiung, Taiwan.

Polavarapu et al, Chemistry of Material, Preparation of Conductive Silver Films at Mild Temperatures for Printable Organic Electronics, 2011, pp. 3273-3276, vol. 23, ACS Publications.

Vo et al, Low-Temperature Preparation of Highly Conductive Thin Films from Acrylic Acid-Stabilized Silver Nanoparticles Prepared through Ligand Exchange, Article, 2011, pp. 17435-17443, vol. 26 (22), School of Chemical Engineering and Bioengineering, University of Ulsan, Republic of Korea.

Wu et al, The Journal of Physical Chemistry, Article, Inkjet Printing of Low-Temperature Cured Silver Patterns by Using AgNO3/1-Dimethylamino-2-propanol Inks on Polymer Substrates, 2011, vol. 115, pp. 10940-10945, ACS Publications.

Walker, SB and Lewis JA, Reactive Inks for Patterning High-Conductivity Features at Mild Temperatures. J. Am. Chem. Soc., 2012, 134, 1419-1421.

Tao, Y, et al. A facile approach to silver conductive ink with high performance fr nanoelectronics. Nanoscale Research Letters. 2013, 8, 296.

International Search Report and Written Opinion on PCT/CA2014/050675 dated Oct. 24, 2014.

European Search report dated Feb. 27, 2017 on European Application 14829173.5.

PROCESS FOR DEPOSITING METAL ON A SUBSTRATE

CROSS-REFERENCE TO RELATED APPLICATIONS

This application is a national phase entry of International Patent Application PCT/CA2014/050675 filed Jul. 16, 2014 and claims the benefit of United States Provisional Patent Application USSN 61/857,734 filed Jul. 24, 2013, the entire contents of both of which are herein incorporated by reference.

FIELD

This application relates to printable electronics, particularly to a process for depositing a metal on a substrate.

BACKGROUND

Commercially available and literature reported conductive inks can be used to print conductive traces of a conductive metal (e.g. silver) on a substrate with resistivity over 3 times, and typically over 7 times, that of the bulk conductive metal. These resistivity values are too high for many applications, such as RFID antennas. Further, inks are generally based on silver or silver-copper composite nanoparticles, which are expensive to produce and result in printed traces that need post-annealing (thermal or photonic) at a high temperature to sinter the particles. Only limited substrate materials resistant to the annealing temperature, normally 140° C., can be used for printing the inks. Thus, current conductive inks have high resistivity, are expensive, need a high temperature post-annealing process, and can be only printed on high-temperature resistant substrates, such as polyethylene terephthalates (PET), polyimides (PI) and polycarbonates (PC).

There is a need for a process for printing conductive inks that is one or more of lower resistivity, less cost, simpler processing and the ability to print on a wider range of substrates.

SUMMARY

There is provided a process for depositing a metal on a substrate, the process comprising: coating a first reducing agent for metal ions onto a surface of a substrate, the first reducing agent capable of initiating reduction of the metal ions to a metal at ambient temperature within 1 hour with generation of heat; applying a solution of the metal ions and a second reducing agent for the metal ions onto the coating of the first reducing agent at ambient temperature, the second reducing agent incapable of initiating reduction of the metal ions to the metal at ambient temperature within 1 hour, to thereby reduce some of the metal ions in a first reduction with the first reducing agent at ambient temperature to deposit the metal on the substrate surface with generation of heat; and, allowing the heat generated by the first reduction to initiate reduction of other of the metal ions in the solution in a second reduction with the second reducing agent at elevated temperature to deposit more of the metal on the substrate.

A process for preparing a reactive metal ink comprising: mixing a metal acetate with ammonium formate in presence of ammonium hydroxide in an aqueous medium at a basic pH.

A reactive metal ink comprising a mixture of a metal acetate and ammonium formate in aqueous ammonium hydroxide at a basic pH.

The metal may be any metal suitable for metal-printed substrates. Conductive and/or reflective metals are preferred. For printable electronic applications, conductive metals are particularly preferred. Some examples of metals include silver, gold, copper, aluminum, platinum, palladium, silver alloys, gold alloys, copper alloys, aluminum alloys, platinum alloys, palladium alloys or mixtures thereof. Silver is preferred. Metal ions may be any reducible cation of the metal, for example metal cations in the +1, +2, +3, +4, +5, +6 or +7 oxidation states. Common cations of metals are known to those skilled in the art. Silver ions in the +1 oxidation state are preferred. Metal ions generally exist in the form of compounds together with one or more counter-ions, and in the case of metal cations the counter-ions are anions. Any suitable counter-ions may accompany the metal ions, for example, halides (e.g. chloride, bromide), carbonate, hydrogen carbonate, sulfate, nitrate, formate and acetate. Preferably, the counter-ion is a weak reducing agent for the metal ion, the weak reducing agent stable towards the metal ion at ambient temperature for at least about 1 hour. The counter-ion may therefore be both a counter-ion for the metal ion and the second reducing agent.

The first reducing may comprise a strong reducing agent towards the metal ion. A strong reducing agent is capable of initiating reduction of the metal ion to elemental metal (i.e. metal in the 0 oxidation state) at ambient temperature within about 1 hour. Ambient temperature is generally considered to be normal room temperature, which is usually in a range of about 15-30° C. Preferably, the first reducing agent is capable of initiating reduction of the metal ions in a time considerably faster than about 1 hour, for example, within about 15 minutes, or within about 5 minutes, or within about 1 minute, or within about 30 seconds, or within about 5 seconds. The first reducing agent may comprise, for example, hydroxylamine, hydroxylamine hydrochloride, reaction product of hydroxylamine and formic acid, reaction product of hydroxylamine and methyl acrylic acid, phenyl hydrazine, reaction product of phenyl hydrazine and formic acid, or mixtures thereof. Hydroxylamine and the reaction product of hydroxylamine and formic acid are preferred, as the other hydroxylamine-based or phenyl hydrazine-based strong reducing agents react more slowly and/or result in poorer quality metal layers. Hydroxylamine results in production of excellent quality conductive layers in a short period of time. However, hydroxylamine evaporates quickly (boiling point of 58° C.) from substrates so the process should be conducted quickly if the hydroxylamine is used. The reaction product of hydroxylamine and formic acid is particularly preferred as this product may be formed in situ on the substrate or prior to coating on the substrate and is stable on the substrate at ambient temperature for over 6 hours. Further, the reduction of metal ions is very rapid at ambient temperature and good quality metal layers may be produced using the reaction product of hydroxylamine and formic acid as the first reducing agent. Furthermore, all of the by-products of the reduction using either hydroxylamine or the reaction product of hydroxylamine and formic acid are small molecules that escape readily from the reduction reaction, thereby reducing contamination and voids in the deposited metal layer.

The first reducing agent may be coated on the substrate in the form of a solution by any suitable method, for example, brushing, pouring and spreading, dipping, printing, spraying or the like. The solution is preferably an aqueous solution in which the first reducing agent has been diluted by about 20-50%. The first reducing agent preferably has a strong chemical or physical affinity for the surface of the substrate to help localized the first reduction at the surface of the substrate by minimizing dissolution of the first reducing agent into the solution of metal ions and second reducing agent applied over top of the coating of first reducing agent. Localization of the first reduction at the surface of the substrate helps localize the deposition of metal, which leads to finer control over feature size and location on the substrate. Localization of the first reduction at the surface of the substrate also assists with a bottom-up reaction mechanism, which helps avoid trapping by-products of the reduction in the metal layer by permitting by-products of the reductions to escape through the top surface of the solution of the metal ions and second reducing agent. The coating of the first reducing agent is preferably dried before applying the solution of metal ions and second reducing agent. Drying is preferably accomplished with a stream of unreactive gas (e.g. air, nitrogen, argon), with or without mild heating to assist with evaporation of the solvent.

The solution of metal ions and second reducing agent may be termed a reactive metal ink solution and is preferably an aqueous solution. The second reducing agent may comprise a weak reducing agent towards the metal ions. A weak reducing agent is incapable of initiating reduction of the metal ion to elemental metal (i.e. metal in the 0 oxidation state) at ambient temperature within about 1 hour, preferably not within about 2 hours, more preferably not within about 6 hours, even more preferably not within about 8 hours. At an elevated temperature, the second reducing agent is capable of initiating reduction of the metal ion to conductive elemental metal within about 1 hour, preferably within about 15 minutes, or within about 5 minutes, or within about 1 minute, or within about 30 seconds, or within about 5 seconds. An elevated temperature may be, for example about 80° C. or greater, or about 85° C. or greater, or about 90° C. or greater. The elevated temperature is preferably about 150° C. or less, for example about 140° C. or less or about 130° C. or less. The elevated temperature is preferably about 90° C. or greater. The elevated temperature is preferably from about 90° C. to about 130° C. The heat generated by the first reduction may provide the heat to raise the temperature of the solution of the metal ions and second reducing agent to the appropriate elevated temperature. The solution of the metal ions and second reducing agent acts as a heat sink to absorb heat produced by the first reduction and to regulate the overall temperature of the process. Thus, a balance in the amount of the first reducing agent is desirable to ensure that there is enough heat to initiate the second reduction but not too much to damage the substrate. The balance depends on the nature of the reducing agents, the particular metal ions and the amount of reactive metal ink solution applied. This two-way heat management makes it possible to form microscaled metal features on the substrate. The second reducing agent may comprise, for example, formic acid (which may exist as a free acid or as a formate salt), N,N-dimethylformamide (DMF, 1-dimethylamino-2-propanol (DP), ethylene glycol or mixtures thereof. Formic acid, particularly a formate salt is preferred. The formate salt may be, for example, ammonium formate or a formate salt of the metal ions.

The solution of the metal ions and second reducing agent may be applied to the substrate over top of the coating of the first reducing agent by any suitable method, for example cast coating and printing. It is a particular advantage of the present process that the solution may be printed on to the substrate. Printing may be accomplished with inkjet printing, flexography printing (e.g. stamps), gravure printing, screen printing, off-set printing, airbrushing, typesetting, or any other printing method. Printing is capable of providing features that are thinner and more accurate than features obtainable using dip-coating or other coating methods, which is particularly useful for fabricating electronic devices, especially small electronic devices.

Deposited layers of metal may be post-treated if desired. Post-treatments may involve the use of another reducing agent (e.g. hydroxylamine, formic acid and the like) to reduce excess metal ions left over from the first and second reductions and/or may involve the use of heat to assist with removing by-products or with completing the reduction of the excess metal ions. If the deposited metal layer is already thick enough for the desired application, no post-treatment with another reducing agent is required and the excess metal ions may be washed away. If further thickening of the deposited metal layer is required, it is preferable to post-treat the deposited layer with another reducing agent while the deposited layer is still wet. Post-treatment with another reducing agent may be completed at ambient temperature with a solution that contains the other reducing agent, or at an elevated temperature with a vapor of the other reducing agent. Post-treatment may further involve washing the substrate having the metal deposited thereon to remove excess reactants and other contaminants from the surfaces of the substrate and metal layers.

The process may be used to deposit metal on any suitable substrate. The substrate is preferably stable at a temperature of up to about 100° C. Some suitable substrates include, for example, non-metallic inorganic materials, plastic materials, fibrous materials and non-conducting metallic materials. Non-metallic inorganic materials include, for example, silicon-based materials (e.g. silicon, silicates). Plastic materials include, for example, polypropylene (PP), polyethylene terephthalates (PET), polyimides (PI), polycarbonates (PC), polyurethanes (PU), composites thereof and mixtures thereof. Fibrous materials include, for example, paper and cardboard. Substrates commonly used in the electronics industry, especially the printable electronics industry, are particularly preferred, including PET films with porous coatings and photo papers.

The present process may be suitable for both batch and continuous processes and may produce at ambient temperature on various substrates highly conductive metal layers (e.g. films, traces and the like) that have the same or substantially the same resistivity as bulk metal using low-cost reactive solution inks. The present process is particularly useful for producing conductive and/or reflective layers (e.g. films, traces and the like) for printing electronic devices, especially RFID antennae, touch switches and smart drug packaging, on various substrates.

Further features will be described or will become apparent in the course of the following detailed description.

BRIEF DESCRIPTION OF THE DRAWINGS

For clearer understanding, preferred embodiments will now be described in detail by way of example, with reference to the accompanying drawings, in which.

DETAILED DESCRIPTION

The present process may produce metal films on a substrate using various coating processes and may form metal features by using various printing methods. The process is amenable to printing or non-dip coating methods using commercial or specialty printers. Printing involves depositing thin liquid layers of the reactive ink solution on the substrate, which results in features that may be thinner and more accurate than features obtainable using dip-coating methods.

The process involves the use of two reduction reactions in a bottom-up based tandem mechanism (starting from substrate surface and working upward). The first reduction reaction starts on the substrate surface at ambient temperature, and the second reduction reaction, which is initiated by the reaction heat of the first reduction reaction, occurs in the reactive ink solution film coated on top, which becomes solid after the reaction. Gas and other small molecules generated from the reduction reactions, and the solvent, can readily escape through the upper surface of the film before the solid metal layer is formed or during post-treatment, with no or few voids left in the metal film. Thus, the process can be used to form highly conductive films and features at ambient temperature on various substrates.

In particular, the process involves a strong reducing agent of metal ion and a metal ion solution (i.e. reactive metal ink) that contains a weak reducing agent and is stable at ambient temperature for a long period. The strong reducing agent may be pre-coated on the substrate surface, and preferably dried. When the reactive metal ink is directly applied on the coated substrate by various means at ambient temperature, the strong reducing agent on the substrate surface may almost immediately initiate the reduction, and cause rapid metal deposition on the substrate surface. Meanwhile, the heat generated during the reaction may be quickly transferred to the reactive metal ink solution to initiate reduction of the metal ions by the weak reducing agent. Thus, additional and major metal deposition happens on top of a thin metal layer that formed during the reduction by the strong reducing agent. Dense and shining metal films may be formed on the substrate in seconds when the film is thin enough. When a thicker film is required, materials in the reactive metal ink solution cannot completely react to form elemental metal during the two reduction steps. In this case, another reducing solution may be subsequently applied on the surface at ambient temperature, so that the remaining reactants can be fully reduced to metal within, for example, 1 minute. The method can be conveniently used in a batch-based process and can be easily implemented in a continuous process at ambient temperature.

EXAMPLE 1

Application to Silver Printing

Figure 1:
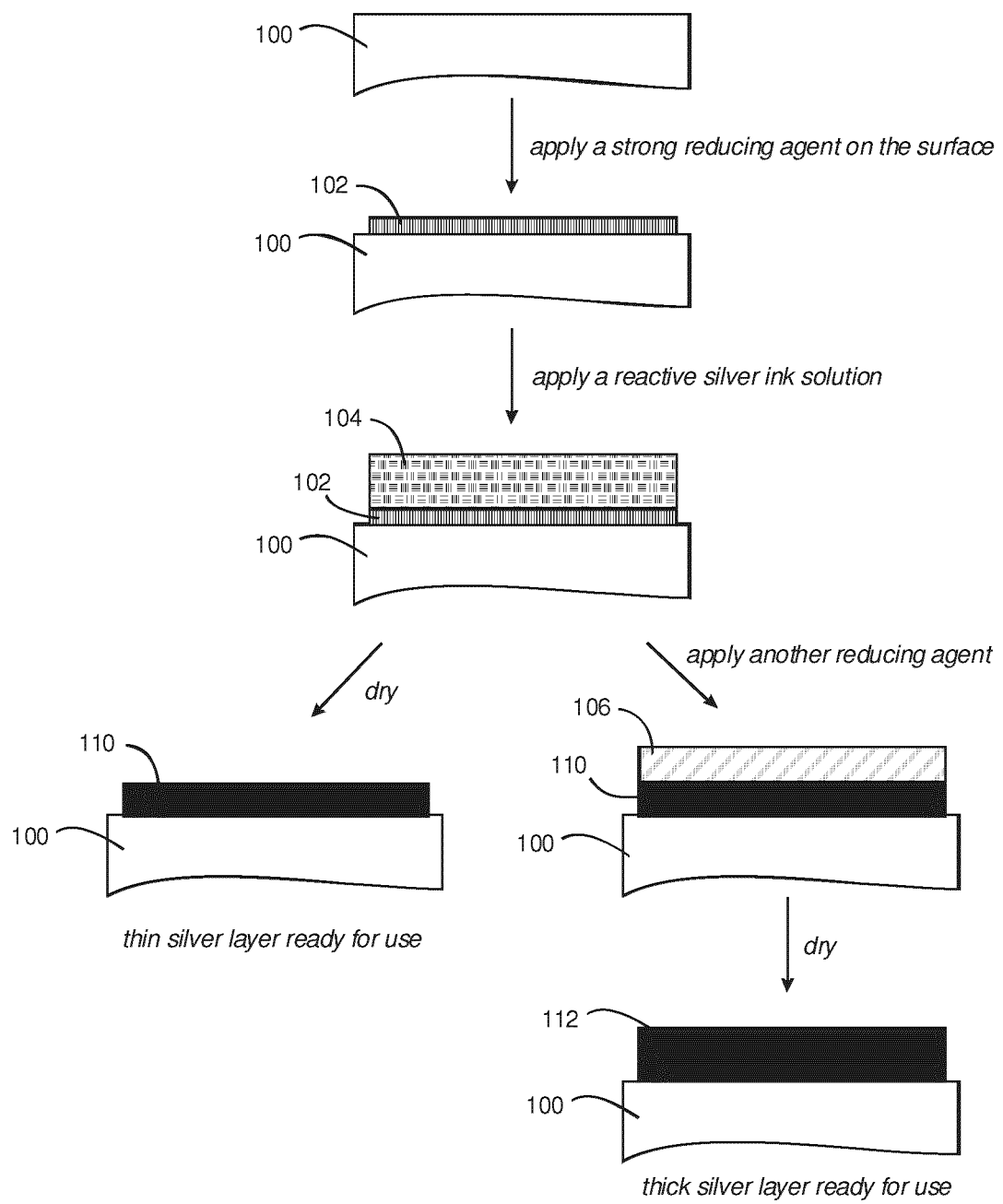
FIG. 1 is a flow chart depicting a process for printing silver on a polyethylene terephthalate (PET) substrate.

A process for printing silver on a polyethylene terephthalate (PET) substrate is illustrated in FIG. 1. A coating of strong reducing agent 102 is applied to substrate 100, for example by brushing or pouring and spreading. The coating of strong reducing agent is then dried and a film of reactive silver ink solution 104 is printed onto the dried coating of strong reducing agent 102, whereupon the strong reducing agent in the coating of strong reducing agent 102 almost immediately begins to reduce silver ions in the film of reactive silver ink solution 104 to form a thin layer of silver on the substrate 100. Heat generated by this reduction quickly initiates further reduction of the silver ions by the weak reducing agent in the film of reactive silver ink solution 104, which causes more deposition of silver to eventually form thin layer 110 of silver on the substrate 100. If the thin silver layer 110 is sufficiently thick, the layer 110 is dried and is then ready for use (see left branch of flow chart). If a thicker layer of silver is desired, another solution of reducing agent 106 may be applied on top of the still wet thin layer of silver 110 in a post-treatment step (see right branch of flow chart), which causes further reduction of non-reacted silver ions and further deposition of silver to form thick layer of silver 112 on the substrate 100.

Figure 2:
FIG. 2 shows a silver film deposited on a PET film, in which the deposited silver was post-treated by exposure to a reducing agent.

FIG. 2 shows a silver film deposited on a PET film, in which the deposited silver was post-processed by exposure to a reducing agent (formic acid or hydroxylamine). The silver films, 5×5 $cm^2$ in area and 1 μm thick, have a resistivity of almost the same as the resistivity of bulk silver.

Figure 3:
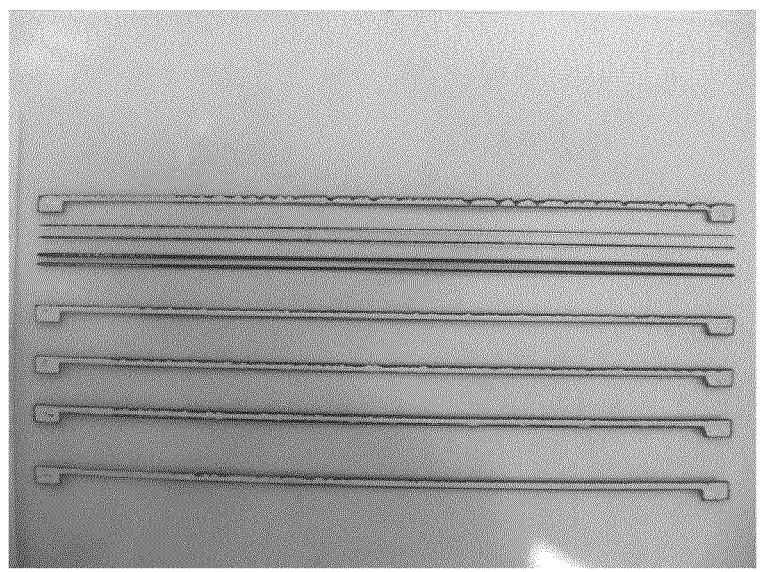
FIG. 3 shows straight lines of silver printed on PET using an inkjet printer without post-treatment.
Figure 4:
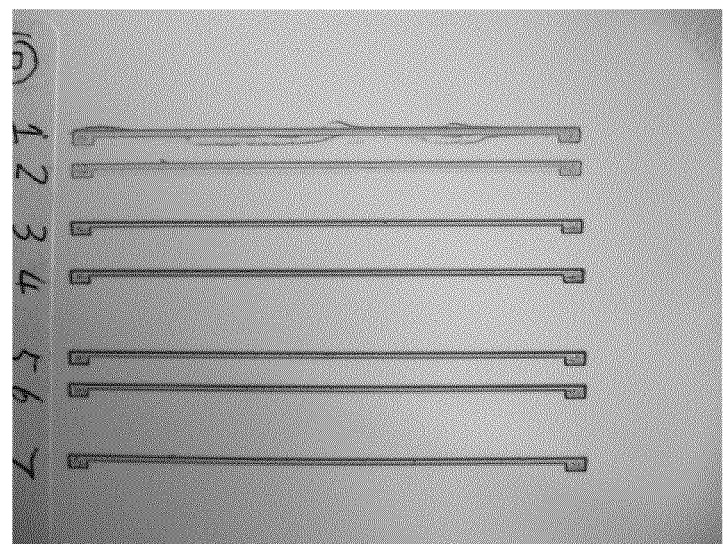
FIG. 4 shows straight lines of silver printed on photo paper using an inkjet printer without post-treatment.
Figure 5:
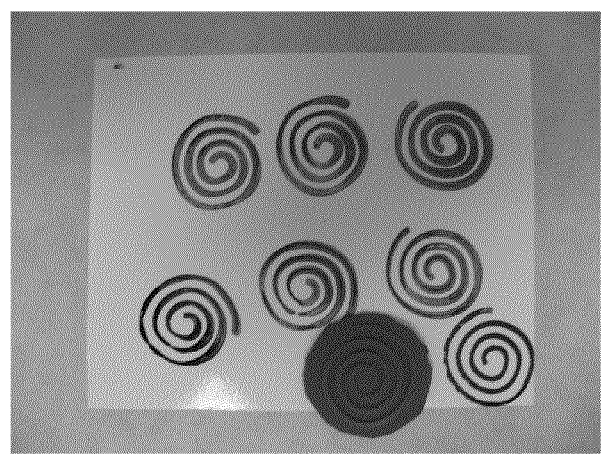
FIG. 5 shows conductive silver spiral lines printed with a rubber stamp on photo paper without post-treatment.

FIG. 3 shows straight lines of silver printed on PET by the present process using a Dimatix 5005 inkjet printer. FIG. 4 shows straight lines of silver printed on Canon photo paper by the present process using a Dimatix 5005 inkjet printer. FIG. 5 shows conductive silver spiral lines printed by the present process with a home-made rubber stamp on HP photo paper. All the lines in FIGS. 3-5 were not post-treated with a reducing agent or a thermal process and are highly conductive.

The following example provides details of how the silver films and lines were prepared.

Coating Strong Reducing Agent on a Substrate:

The reaction product of hydroxylamine and formic acid was diluted with deionized water by 50% to form a solution of strong reducing agent. The solution of strong reducing agent was applied to a PET film or photo paper with porous surface and high surface tension using a brush. Alternatively, the solution of strong reducing agent was poured onto the surface of a first PET film and spread with a glass rod or a second PET film to uniformly spread the solution on the first film (a process that be implemented by a series of rolls). A stream of compressed air was passed over the coated PET film or photo paper to remove water until the coating on the PET film or photo paper was dry.

The strong reducing agent preferably has strong adhesion to the substrate, otherwise the strong reducing agent may migrate to the reactive ink solution and reduce silver in the solution rather than at the surface of the substrate resulting in the formation of silver metal films. Also, the strong reducing agent preferably covers the substrate sufficiently to generate sufficient heat to initiate the second reducing reaction by the weak reducing agent. However, if there is too much of the strong reducing agent on the substrate surface, the excessive heat generated may be too much for the reactive ink solution to utilize, thereby possibly damaging the substrate.

Preparing Reactive Silver Ink Solution Containing Weak Reducing Agent:

The reactive silver ink solution was modified from the prior art (Walker 2012) since the prior art ink generates dark brown or black silver oxide (not silver) after it is coated and dried at room temperature, and then heated. The prior art ink only generates silver when the wet coating is quickly heated to around 80-90° C. and above, but the obtained coating is very rough and the surface is very porous. Since drying occurs during printing, the prior art ink is not suitable for printing.

Instead, the reactive ink solution used in this example was prepared as follows. One gram of silver acetate was added into 1.3 ml aqueous ammonium hydroxide and dissolved by mixing. Then, 0.25 g ammonium formate (formic acid is the weak reducing agent) was added into the solution and dissolved. The reactive ink solution is highly basic. Afterwards, 0.1 ml acetic acid was added into the solution to adjust the pH to a range of about 9.5-10.5. No precipitation was observed during the mixing and the obtained solution can be maintained without precipitation at ambient temperature for over one week. Silver load in the solution was more than twice that reported in the prior art (Walker 2012), and no filtering was required during the preparation.

When the reactive silver ink solution is to be printed, a commercial surfactant at a concentration of about 0.1-0.3 wt % may be added to the solution to reduce surface tension to control quality of printed features.

The reactive silver ink solution may be printed on a substrate to form liquid films. If the films are dried at a temperature up to 50-60° C., they become yellowish-brownish with discrete crystals (silver acetate) distributed throughout and the films are not conductive. If the films are dried between 60° C. and 80° C., the reduction reaction is slow, the films become dark brown or even black (silver oxide, silver) and the films are poorly conductive. If the films are dried at or above about 90° C., the reduction reaction is faster, the films exhibit a rough metal colour surface and the films exhibit good conductivity. Thus, temperatures of about 85° C. or higher are preferred for the reduction reaction of the weak reducing agent.

Film Deposition on the Substrate:

The reactive silver ink solution was directly deposited on the strong reducing agent-coated substrate in air using various methods. A simple casting was done by pouring the solution or pipetting the solution onto the surface and spreading the solution to form uniform liquid films with a glass rod, PET film, or compressed air blowing. The cast process can be scaled-up to a continuous roll-to-roll coating process. The process is suitable for forming uniform conductive films.

Printing lines and other features was done by directly jetting the ink solution onto the substrate using a commercial inkjet printer (e.g. Dimitix) or by transferring ink solution onto the substrate using a stamp (concept tested for flexography printing and gravure printing), or dropping the ink solution onto the substrate through patterned open space in a plastic film (concept tested for screen printing).

The ink cast or printed on the coated substrate reacts with the strong reducing agent almost immediately at room temperature in air, forming a thin layer of silver on the substrate surface very quickly (within 1 second). The heat generated by this first reduction is quickly transferred into the reactive ink solution and initiates the second reduction by the weak reducing agent. Gases, such as $CO_2$, $NH_3$, $N_2$ and $H_2O$, generated from the two reduction reactions quickly escape from the upper surface before the films are converted into solid phase from liquid phase. The whole process can be completed with one minute. Solid silver films or features were obtained from the process.

Table 1 provides results of 4-point electrical testing of the 5×5 $cm^2$ silver films deposited on a PET substrate and post-treated with formic acid (FA) or hydroxylamine (MA).

TABLE 1

| Films | Current (A) | Voltage (V) | Thickness (m) | Resistivity (Ω · m) |
|---|---|---|---|---|
| FA-1 | 0.001 | $1.6 \times 10^{-5}$ | $1.14 \times 10^{-6}$ | $1.824 \times 10^{-8}$ |
| FA-2 | 0.001 | $1.4 \times 10^{-5}$ | $1.01 \times 10^{-7}$ | $1.414 \times 10^{-9}$ |
| HA-1 | 0.001 | $2.4 \times 10^{-5}$ | $8.5 \times 10^{-7}$ | $2.04 \times 10^{-8}$ |
| HA-2 | 0.001 | $1.2 \times 10^{-5}$ | $1.95 \times 10^{-6}$ | $2.34 \times 10^{-8}$ |
| HA-3 | 0.001 | $2.3 \times 10^{-5}$ | $8 \times 10^{-7}$ | $1.84 \times 10^{-8}$ |

Table 2 provides results of preliminary electrical testing using a multimeter of printed silver lines.

TABLE 2

| Substrate | Line Width (m) | Line Thickness (m) | Resistance (Ω) | Resistivity (Ω · m) |
|---|---|---|---|---|
| PET | $3.2 \times 10^{-4}$ | $1.30 \times 10^{-6}$ | 9.8 | $7.41 \times 10^{-8}$ |
| PET | $3.7 \times 10^{-4}$ | $1.40 \times 10^{-6}$ | 9.7 | $9.14 \times 10^{-8}$ |
| PET | $3.3 \times 10^{-4}$ | $1.50 \times 10^{-6}$ | 8.9 | $8.01 \times 10^{-8}$ |
| Photo paper | $5.2 \times 10^{-4}$ | $1.50 \times 10^{-6}$ | 9.8 | $1.39 \times 10^{-7}$ |
| Photo paper | $4.7 \times 10^{-4}$ | $1.40 \times 10^{-6}$ | 11 | $1.32 \times 10^{-7}$ |

The conductivity of the cast films as seen in Table 1 is substantially identical to that of bulk silver, demonstrating that pure and dense silver can be obtained from the present process. The resistivity of the printing lines showed in Table 2 are not as good as that of the cast films since the ink formation was not optimized for the printing process and the printed lines have very rough edges due to the high surface tension of the ink. When this printing related defect is eliminated through changing the surface tension of the formulation, the same resistivity as that of the film should be obtained from the printed line. Nevertheless, even though the printed lines are rough, their resistivity is still better than all commercial nanosilver inks that were tested. Perfect lines printed using the same inkjet printer on identical PET substrates using popular nanosilver inks from Novacentric, for instance, have a minimum resistivity of $14.4 \times 10^{-8}$ (Ω·m) after thermal or photo annealing. This resistivity value is almost twice the resistivity values of the rough lines printed using the presently disclosed process (lines on PET in Table 2). Even rough lines printed in accordance with the present process have better conductivity than perfect lines printed in accordance with the prior art.

If there is no weak reducing agent in the reactive ink solution, the heat generated from the silver reduction reaction by the strong reducing agent may damage the coatings on PET or photo paper or prevent the formation of good silver films if the substrate is thermally resistant. The second reduction reaction that happens in the upper reactive ink solution under the weak reducing agent can consume the heat generated by the first reduction reaction while introducing additional and substantial silver deposition. This two-way heat management makes it possible to form microscaled silver on the substrate.

The bottom up-based tandem process of the two reduction reactions allows silver to build up from the substrate surface, and allows the generated gases to escape without being trapped within the film during the solidification process, which results in high conductivity. Micro-thick silver deposition (1 μm typical and 3-7 μm with a post-treatment process) can be achieved. Without the present process, rough and porous silver films with poor conductivity are usually obtained. For instance, there is no way to obtain highly conductive films by prior methods that quickly mix a silver ion solution with a reducing agent and then cast the mixture onto a substrate.

References: The contents of the entirety of each of which are incorporated by this reference.

Dearden A L, Smith P J, Shin D-Y, Reis N, Derby B, O'Brien P. (2005) A Low Curing Temperature Silver Ink for Use in Ink-Jet Printing and Subsequent Production of Conductive Tracks. *Macromolecular Rapid Communication.* 26, 315-318.

Dong T-Y, Chen W-T, Wang C-W, Chen C-P, Chen C-N, Lin M-C, Song J-M, Chenc I-G, Kao T-H. (2009) One-step synthesis of uniform silver nanoparticles capped by saturated decanoate: direct spray printing ink to form metallic silver films. *Physical Chemistry Chemical Physics.* 11, 6269-6275.

Doty W R, Kinney T J. (1976) Method for Treating Polymeric Substrates Prior to Plating. U.S. Pat. No. 3,962,497 issued Jun. 8, 1976.

Lee C-L, Chang K-C, Syu C-M. (2011) Silver nanoplates as inkjet ink particles for metallization at a low baking temperature of 100° C. *Colloid and Surfaces A: Physicochemical and Engineering Aspects.* 381, 85-91.

Polavarapu L, Manga K K, Cao H D, Loh K P, Xu Q-H. (2011) Preparation of Conductive Silver Films at Mild Temperatures for Printable Organic Electronics. *Chemistry of Materials.* 23, 3273-3276.

Vo D Q, Shin E W, Kim J-S, Kim S. (2010) Low-Temperature Preparation of Highly Conductive Thin Films from Acrylic Acid-Stabilized Silver Nanoparticles Prepared through Ligand Exchange. *Langmuir.* 26, 17435-17443.

Walker S B, Lewis J A. (2012) Reactive Silver Inks for Patterning High-Conductivity Features at Mild Temperatures. *Journal of the American Chemistry Society (JACS).* 134, 1419-1421.

Wu J-T, Hsu S L-C, Tsai M-H, Hwang W-S. (2011) Ink-Jet Printing of Low Temperature Cured Silver Patterns by Using $AgNO_3$/1-Dimethylamino-2-propanol Inks on Polymer Substrates. *The Journal of Physical Chemistry C.* 115, 10940-10945.

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A process for depositing a metal on a substrate, the process comprising:
    coating a first reducing agent for metal ions onto a surface of a substrate, the first reducing agent capable of initiating reduction of the metal ions to a metal at ambient temperature within 1 hour with generation of heat;
    applying a solution of the metal ions and a second reducing agent for the metal ions onto the coating of the first reducing agent at ambient temperature, the second reducing agent incapable of initiating reduction of the metal ions to the metal at ambient temperature within 1 hour, to thereby reduce some of the metal ions in a first reduction with the first reducing agent at ambient temperature to deposit the metal on the substrate surface with generation of heat; and,
    allowing the heat generated by the first reduction to initiate reduction of other of the metal ions in the solution in a second reduction with the second reducing agent at an elevated temperature of 80° C. or greater to deposit more of the metal on the substrate in a bottom-up manner starting from the surface of the substrate and working upward, the second reduction absorbing enough of the heat generated by the first reduction to regulate the temperature of the process to reduce damage to the substrate,
    wherein the first reducing agent comprises hydroxylamine or a reaction product of hydroxylamine and formic acid, the first reduction occurs at the surface of the substrate, the second reduction occurs in the solution of metal ions and second reducing agent above the coating of first reducing agent, the first and second reductions occur in tandem entirely in a bottom-up manner throughout the entire process of metal deposition, and by-products of the first and second reductions escape through a top surface of the solution of the metal ions and second reducing agent before being trapped in the metal deposited on the substrate.

2. The process according to claim 1, wherein the metal ions comprise cations of silver, gold, copper, aluminum or mixtures thereof.

3. The process according to claim 1, wherein the metal ions comprise cations of silver.

4. The process according to claim 1, wherein the solution of metal ions and second reducing agent is applied by printing.

5. The process according to claim 1, wherein the first reducing agent is capable of initiating reduction of the metal ions within 5 seconds at ambient temperature.

6. The process according to claim 1, wherein the second reducing agent is incapable of initiating reduction of the metal ions within 8 hours at ambient temperature.

7. The process according to claim 1, wherein the elevated temperature is in a range of about 90-130° C.

8. The process according to claim 1, wherein the ambient temperature is in a range of about 15-30° C.

9. The process according to claim 1, wherein the second reducing agent comprises formic acid or a formate salt.

10. The process according to claim 1, wherein the solution of metal ions and second reducing agent is formed by reacting a metal acetate with ammonium formic acid in presence of ammonium hydroxide in an aqueous medium at a basic pH.

11. The process according to claim 1, wherein the solution of metal ions and second reducing agent is applied by inkjet printing, flexography printing, gravure printing, screen printing, typesetting or off-set printing.

12. The process according to claim 1, wherein the substrate comprises a plastic material or a fibrous material.

13. The process according to claim 1, wherein the substrate is porous.

* * * * *